U S007870524B1

(12) United States Patent
Alfieri et al.

(10) Patent No.: US 7,870,524 B1
(45) Date of Patent: Jan. 11, 2011

(54) METHOD AND SYSTEM FOR AUTOMATING UNIT PERFORMANCE TESTING IN INTEGRATED CIRCUIT DESIGN

(75) Inventors: Robert A. Alfieri, Chapel Hill, NC (US); Rajeshwaran Selvanesan, Milpitas, CA (US); Prasad Gharpure, Fremont, CA (US); John Douglas Tynefield, Jr., Los Altos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 465 days.

(21) Appl. No.: 11/860,475

(22) Filed: Sep. 24, 2007

(51) Int. Cl.
*G06F 17/50* (2006.01)

(52) U.S. Cl. .................. 716/5; 716/1; 716/2; 716/4; 716/6; 716/18; 703/13; 703/14

(58) Field of Classification Search .............. 716/1–6, 716/18; 703/13, 14
See application file for complete search history.

(56) References Cited

U.S. PATENT DOCUMENTS

| | | | |
|---|---|---|---|
| 6,216,252 B1 * | 4/2001 | Dangelo et al. ............... 716/1 |
| 6,263,301 B1 * | 7/2001 | Cox et al. .................... 703/14 |
| 6,360,353 B1 * | 3/2002 | Pember et al. ................ 716/4 |
| 6,421,634 B1 * | 7/2002 | Dearth et al. ................ 703/14 |
| 6,704,889 B2 * | 3/2004 | Veenstra et al. .............. 714/39 |
| 6,810,442 B1 * | 10/2004 | Lin et al. ..................... 710/22 |
| 6,871,331 B1 * | 3/2005 | Bloom et al. .................. 716/4 |
| 7,031,900 B1 * | 4/2006 | Vakada et al. ................ 703/17 |
| 7,165,231 B2 * | 1/2007 | Buckley ....................... 716/5 |
| 7,386,827 B1 * | 6/2008 | Zhu et al. .................... 716/16 |
| 7,546,571 B2 * | 6/2009 | Mankin et al. ................ 716/15 |
| 7,561,999 B2 * | 7/2009 | Iwamoto et al. .............. 703/14 |
| 2006/0117274 A1 * | 6/2006 | Tseng et al. .................. 716/1 |
| 2007/0266361 A1 * | 11/2007 | Yamamoto ................... 716/17 |
| 2008/0263486 A1 * | 10/2008 | Alexanian et al. ............ 716/5 |
| 2009/0150136 A1 * | 6/2009 | Yang .......................... 703/13 |

OTHER PUBLICATIONS

Badawy; "Principles of verifiable RTL design [Book Review]"; Jan. 2002; Circuits and Devices Magazine, IEEE; vol. 18, Issue 1, pp. 26-27.*

Haufe et al.; "Ad-Hoc Translations to Close Verilog Semantics Gap"; Apr. 16-18, 2008; Design and Diagnostics of Electronic Circuits and Systems, 2008. DDECS 2008. 11th IEEE Workshop on; pp. 1-6.*

* cited by examiner

*Primary Examiner*—Helen Rossoshek
(74) *Attorney, Agent, or Firm*—Patterson & Sheridan, LLP (57) ABSTRACT

A method and system for automating unit performance testing in integrated circuit design is disclosed. One embodiment of the present invention sets forth a method, which includes the steps of generating a first performance data for the unit to operate on a workload, embedding the first performance data in the workload for a register transfer level (RTL) implementation of the unit to operate on, and determining whether the expected performance of the unit is achieved based on the comparison between the first performance data and a second performance data, wherein the second performance data is generated after the RTL implementation of the unit operates on the workload.

15 Claims, 6 Drawing Sheets

METHOD AND SYSTEM FOR AUTOMATING UNIT PERFORMANCE TESTING IN INTEGRATED CIRCUIT DESIGN

BACKGROUND OF THE INVENTION

1. Field of the Invention

Embodiments of the present invention relate generally to integrated circuit design and more specifically to a method and system for automating unit performance testing in integrated circuit design.

2. Description of the Related Art

Unless otherwise indicated herein, the approaches described in this section are not prior art to the claims in this application and are not admitted to be prior art by inclusion in this section.

Integrated circuit (IC) design involves the creation of electronic components, such as transistors, resistors, capacitors, and the metallic interconnect of these components onto a piece of semiconductor. Broadly speaking, digital IC design can be divided into three phases: 1) electronic system-level (ESL) design phase, 2) register transfer level (RTL) design phase, and 3) physical design phase. In the ESL phase, the user functional specification is defined and verified. In the RTL design phase, this user functional specification is converted into RTL description, which specifies in detail how each bit of the IC should behave on every clock cycle. Lastly, in the physical design phase, a chip design is generated based on the RTL description and a library of available logic gates. Here, issues such as which logic gates to use, where to place the gates, and how to wire them together are addressed. After resolving these issues, the chip is taped out, and the design data is converted into photomasks.

Figure 1A:
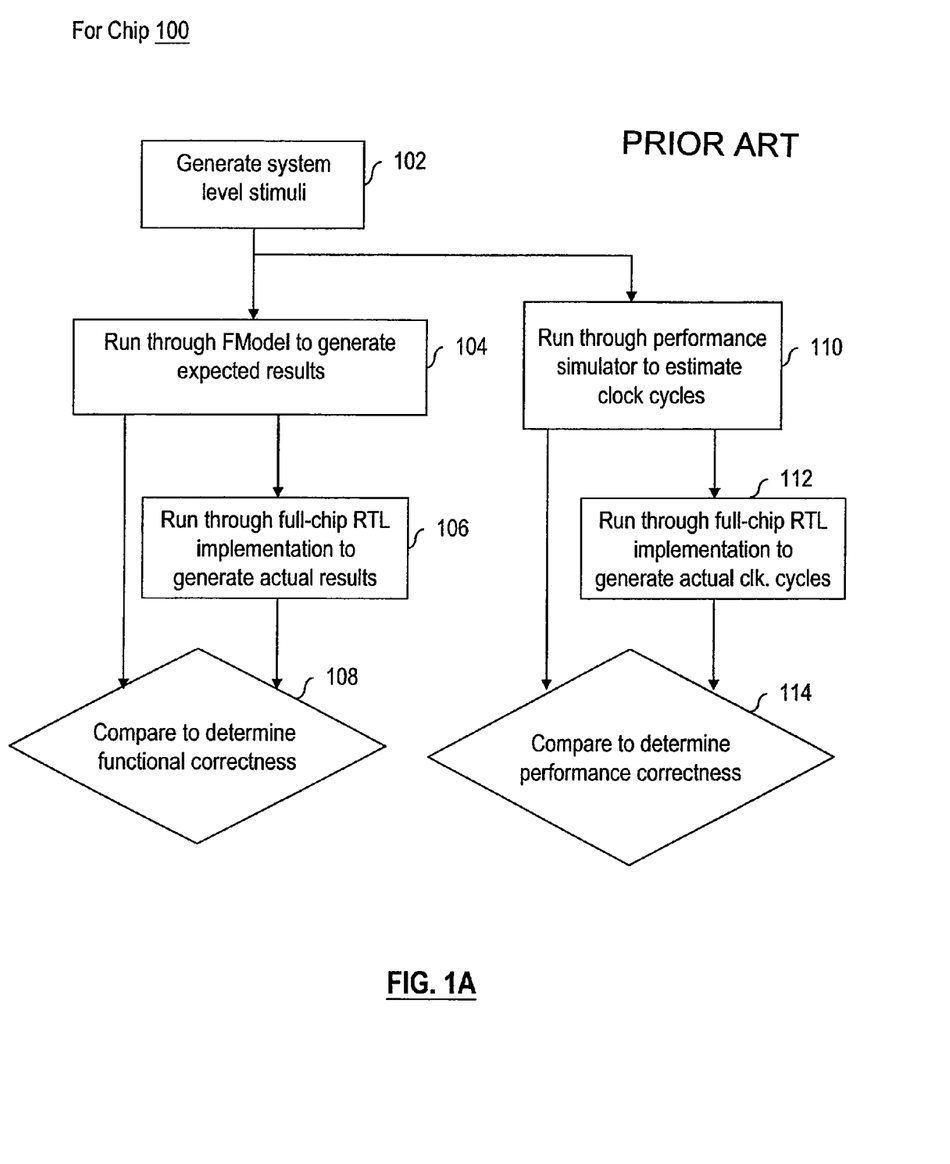
FIG. 1A is a conventional approach of verifying both the functional correctness and the performance correctness of a chip prior to entering the physical design phase.

As ICs become increasingly complex and contain a large number of units, designing and verifying such ICs becomes more and more difficult. FIG. 1A is a conventional approach of verifying both the functional correctness and the performance correctness of a chip 100 prior to entering the physical design phase. Suppose the chip 100 is a graphics processing unit. In step 102, system level stimuli are generated to be fed into the functional model verification environment (FModel), which is designed to generate a set of expected test results according to the user functional specification for the entire chip 100 in step 104. The system level stimuli here generally refer to graphics related commands. In step 106, the full-chip RTL implementation generates a set of actual test results also based on the same system level stimuli. Then, the expected test results are compared to the actual test results in step 108 to determine whether the chip 100 as a whole performs the specified functions as expected. Similarly, the same system level stimuli are fed into the performance simulator in step 110 and also the full-chip RTL implementation of the chip 100 in step 112. The performance simulator estimates a number of clock cycles for the entire chip 100 to respond to or operate on the system level stimuli. This estimated clock cycle count is then compared with the actual clock cycle count that the full-chip RTL implementation takes to determine whether the performance of the full-chip RTL implementation is considered to be correct.

The aforementioned approach has several shortcomings. One, given the complexity of the chip and also the traffic streams that it may receive, developing and deploying the programs and environment to effectively and thoroughly verify the entire chip 100 is difficult and time consuming, because such efforts require the consideration of all possible operating paths in the chip 100. Two, even if the full-chip tests are developed and deployed and even if they successfully detect deviations from the expected results, they still lack any flexibility to efficiently identify the failing units in the chip that cause such deviations. Three, to test on a full-chip level also means that such testing cannot begin until the RTL implementation of the chip 100 is completed. This serial dependency between the RTL implementation of the chip and the testing of the chip often leads to either insufficient amount of testing on the chip or intolerable delays in releasing the chip.

Figure 1B:
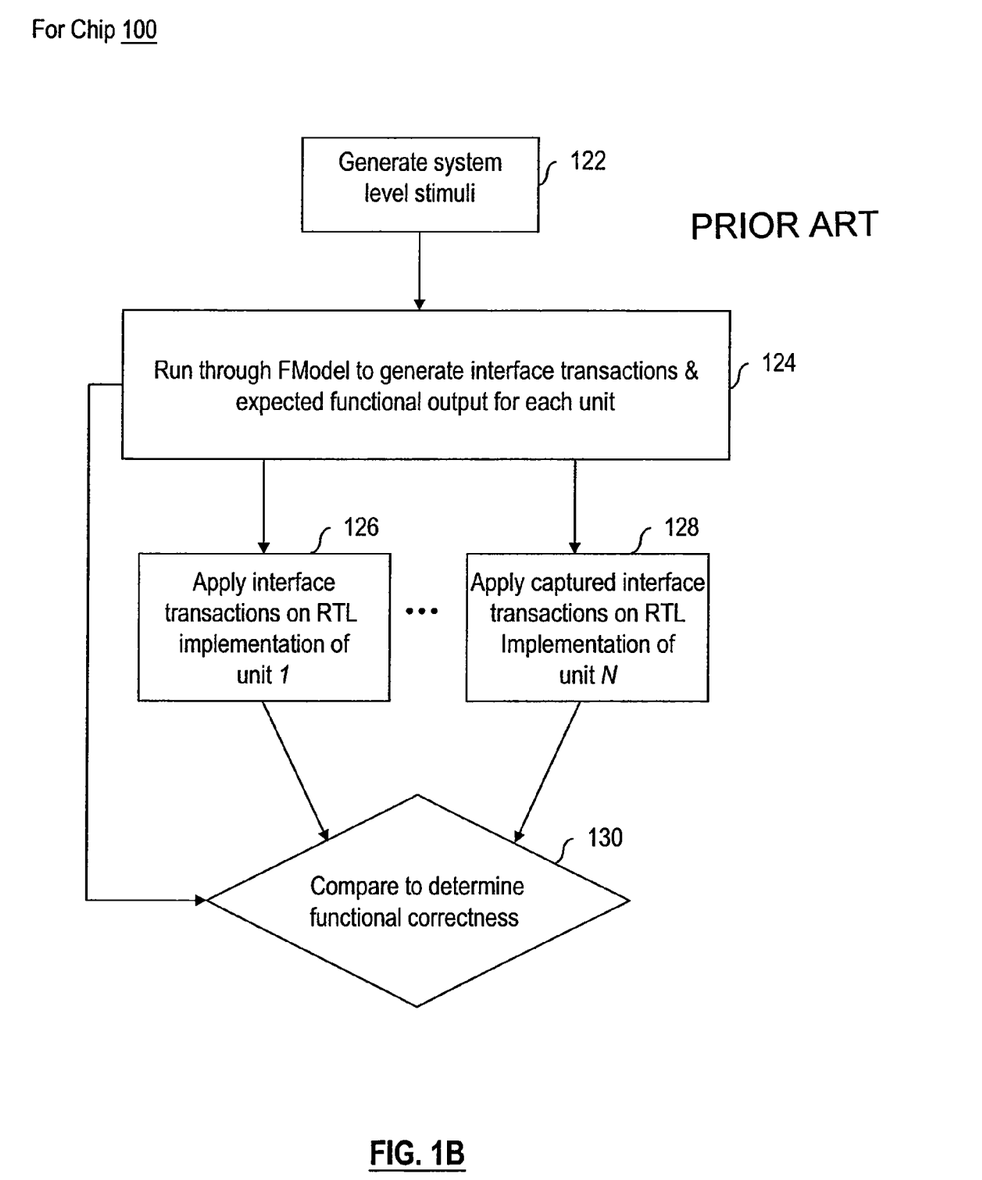
FIG. 1B is yet another conventional approach in verifying the functional correctness of a chip prior to entering the physical design phase but at the unit level of the chip.

FIG. 1B is yet another conventional approach in verifying the functional correctness of the chip 100 prior to entering the physical design phase but at the unit level of the chip 100. Here, the system level stimuli generated in step 122 still go into the FModel in step 124. However, unlike step 104 in FIG. 1A, the FModel generates interface transactions associated with the stimuli and also the expected functional output for each unit in the chip 100. Each "interface transaction" refers to work for a particular unit in the chip 100 to operate on. Then, in steps 126 and 128, the interface transactions are applied to the RTL implementations of the designated units, such as unit 1 and unit N. The actual functional outputs of the RTL implementations of unit 1 and unit N are compared with the expected functional outputs of the same units from the FModel in step 130 to determine whether functional correctness of each RTL implementation of the unit is achieved. One significant drawback of this conventional approach is the inability to spot performance issues at the unit level. Worse yet, some performance bugs at one unit may hinder efforts to identify other performance bugs associated with other units.

As the foregoing illustrates, what is needed is an improved way of automating unit-level performance testing in IC design and address at least the problems set forth above.

SUMMARY OF THE INVENTION

A method and system for automating unit performance testing in integrated circuit design is disclosed. One embodiment of the present invention sets forth a method, which includes the steps of generating a first performance data for the unit to operate on a workload, embedding the first performance data in the workload for a register transfer level (RTL) implementation of the unit to operate on, and determining whether the expected performance of the unit is achieved based on the comparison between the first performance data and a second performance data, wherein the second performance data is generated after the RTL implementation of the unit operates on the workload.

One advantage of the disclosed method and system is that performance verification for each unit in an IC can occur in parallel and with different test patterns. This allows for testing on the front end and efficiently identifying the failing units.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Throughout this disclosure, a "state bundle" generally refers to a data structure, which a unit in a GPU uses to transmit state information to the various units of the GPU. The term "bundle decoder" is used interchangeably with "decoder" in this disclosure. Each bundle decoder is associated with a unit in the GPU and is configured to retrieve various performance markers (also referred to as triggers).

Figure 2:
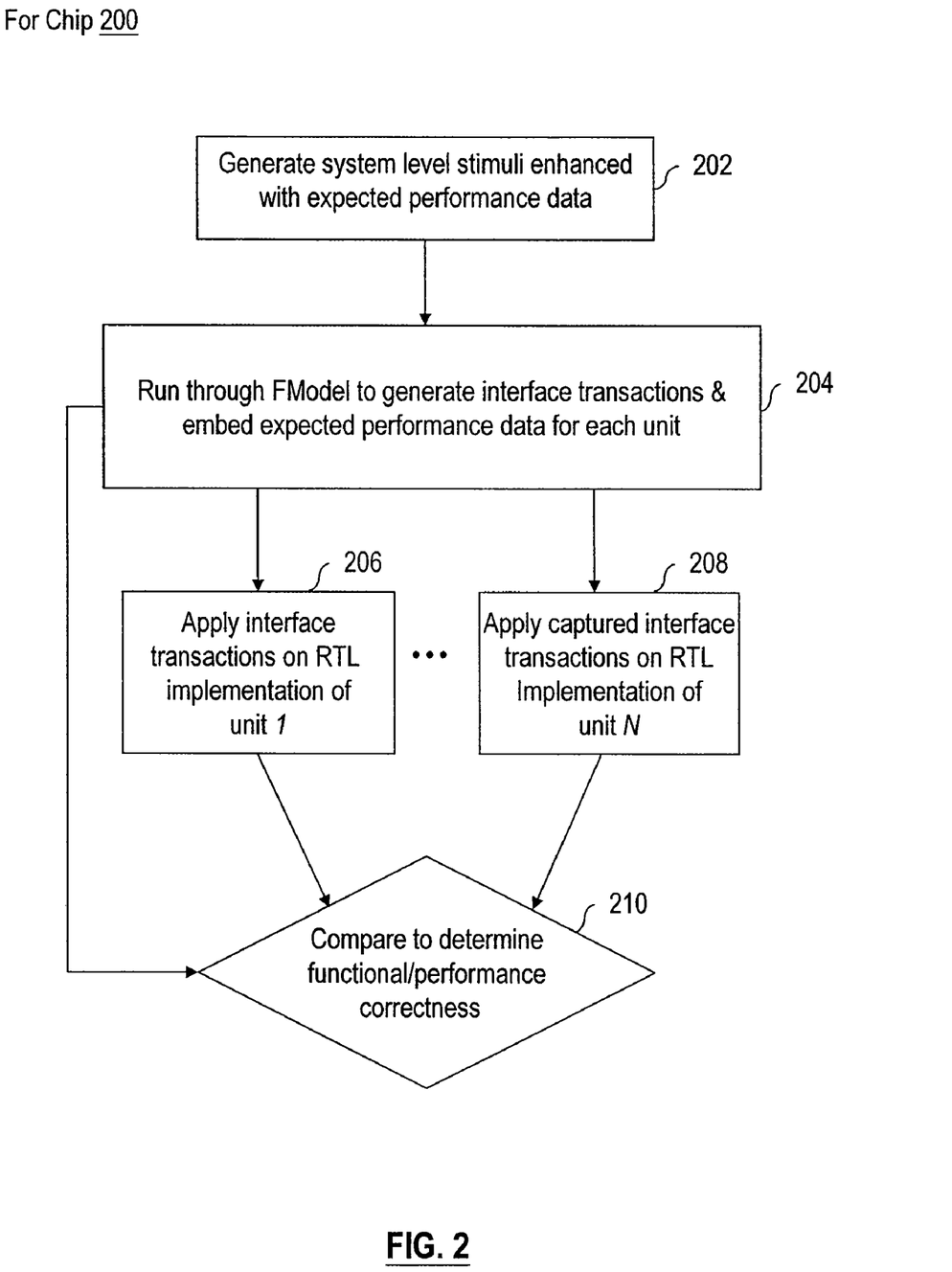
FIG. 2 is a flow chart illustrating method steps of conducting unit-level performance testing for a chip, according to one embodiment of the present invention.

FIG. 2 is a flow chart illustrating method steps of conducting unit-level performance testing for a chip 200, according to one embodiment of the present invention. Suppose there are N units in the RTL implementation of the chip 200. In step 202, system level stimuli along with the expected performance data for each of the N units are generated to be fed into the FModel. Subsequent paragraphs will further detail how such expected performance data is generated. Based on the received information, the FModel in step 204 generates interface transactions, or workload to be performed, for each of the N units and also embeds the expected performance data in such interface transactions. These interface transactions are then applied to each of the N units in the RTL implementation such as shown in steps 206 and 208. The actual performance of each of the N units is measured as the unit operates on the interface transactions and is then compared with the embedded expected performance data in step 210. In one implementation, the embedded expected performance data is not operated on or tampered with by any of the N units. In addition, in the same manner as described in conjunction with FIG. 1B above, the functional correctness for each of the N units is also verified in step 210.

Figure 3:
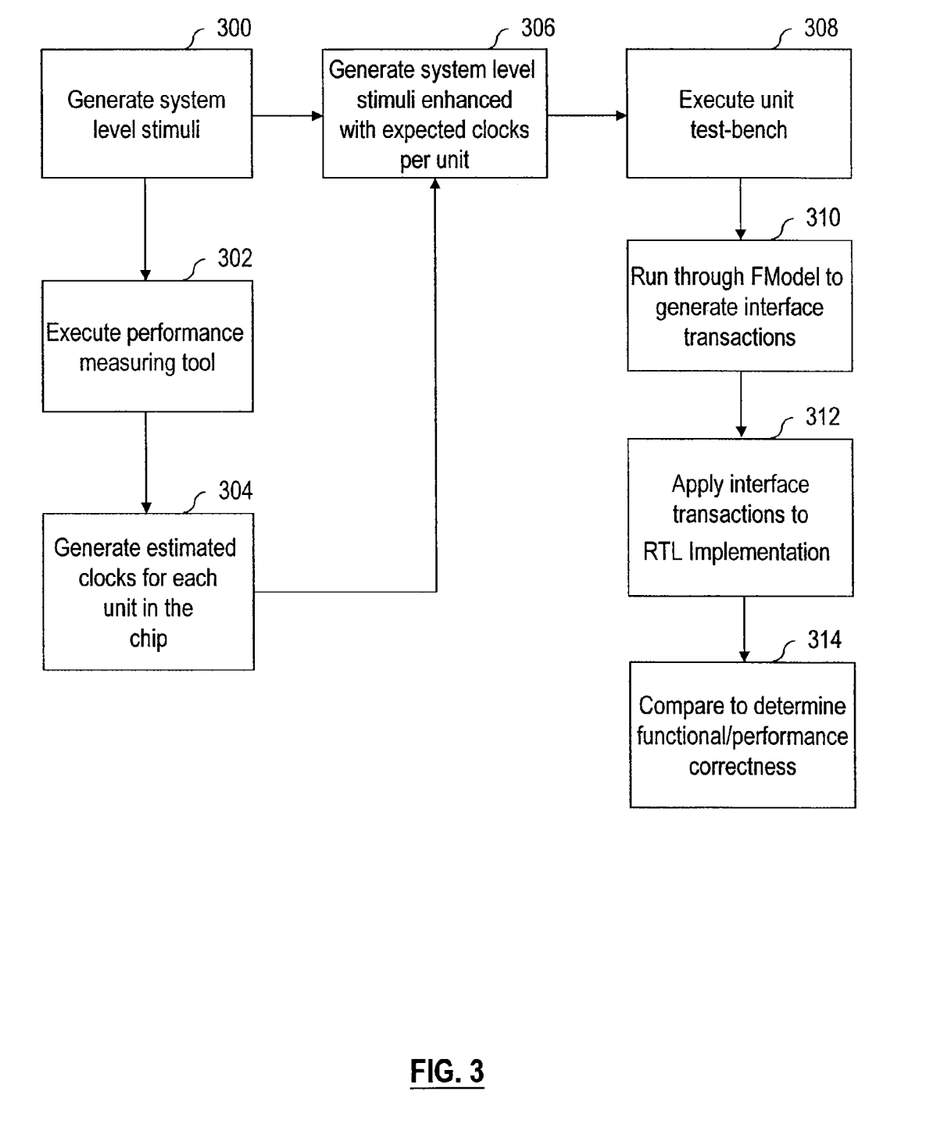
FIG. 3 is a flow chart illustrating the method steps of generating and embedding expected performance data on a unit-level basis for automated testing, according to one embodiment of the present invention.

FIG. 3 is a flow chart illustrating the method steps of generating and embedding expected performance data on a unit-level basis for automated testing, according to one embodiment of the present invention. In step 300, system level stimuli for the chip 200 are generated and are fed into a performance measuring tool in step 302. The performance measuring tool is capable of estimating how each unit in the chip 200 should perform if given such system level stimuli. Some examples of the performance measuring tool include, without limitation, a performance simulator program and a performance modeling program. The estimated clock cycles for each unit are generated in step 304. The estimated clock cycle information is then bundled with the same system level stimuli in step 306 before the bundled information is sent to a unit test-bench for processing in step 308. Subsequent paragraphs will detail one implementation of the unit test-bench.

Similar to the discussions above, in step 310, the system level stimuli and the estimated clock cycle information are fed into the FModel, which generates interface transactions for the N units in the chip 200 and also the functional outputs for each of the N units of the chip 200 accordingly. The generated interface transactions are then processed by the RTL implementations of the N units in step 312, and the actual functional outputs and the actual performance data measured from such processing are compared with the expected functional outputs and the estimated clock cycle information to determine whether functional and performance correctness is achieved in step 314.

Figure 4:
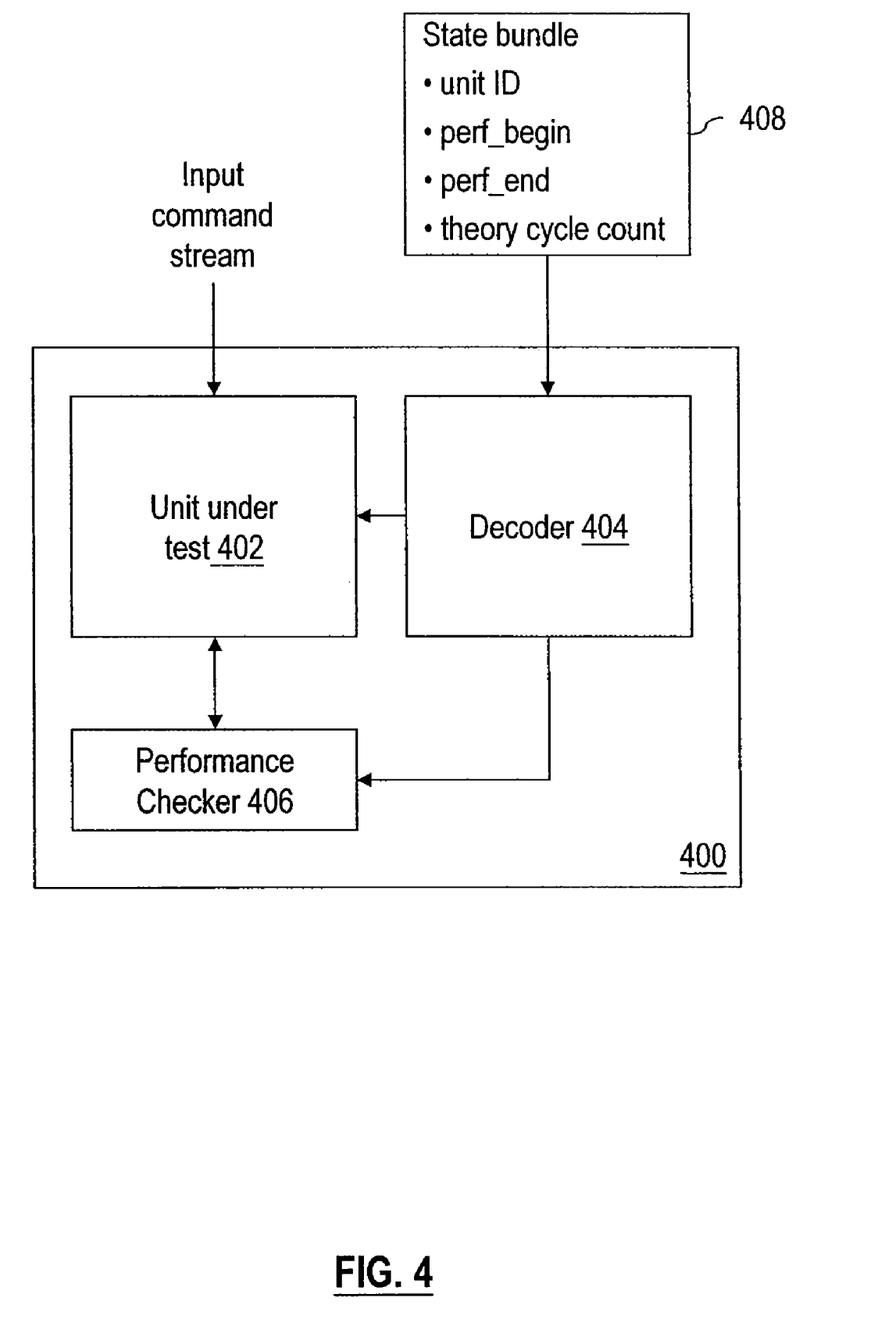
FIG. 4 is a conceptual diagram of a unit test-bench, according to one embodiment of the present invention.

FIG. 4 is a conceptual diagram of a unit test-bench 400, according to one embodiment of the present invention. The unit test-bench 400 includes a unit under test 402 and a decoder 404 and also a performance checker 406 associated with such a unit. Suppose the unit under test 402 corresponds to unit 1 of the N units in the chip 200. Suppose further that the estimated clock cycle count for unit 1 is 100 clock cycles. As mentioned above, the unit test-bench 400 receives both the system level stimuli and also the estimated clock cycle count. In one implementation, the estimated 100 clock cycles are stored in a state bundle 408 associated with the unit ID corresponding to unit 1. In addition to the estimated 100 clock cycles (i.e., theory cycle count shown in FIG. 4), the state bundle 408 should also include a performance begin trigger (e.g., perf_begin) and a performance end trigger (e.g., perf_end). As the unit under test 402 operates on the input command stream derived from the system level stimuli, it is also receiving decoded information, such as the perf_begin or the perf_end triggers from the decoder 404. Its associated performance checker 406 computes the actual number of clock cycles starting from the time the unit test-bench 400 receives the state bundle containing the perf_begin trigger and the time the unit test-bench 400 receives the state bundle containing the perf_end trigger. The performance checker 406 also compares this actual number of clock cycles with the theory cycle count of 100 to see whether the RTL implementation of unit 1 achieves the expected performance requirements. It should be noted that the unit test-bench 400 does not modify the state bundle 408, and the performance checker 406 subtracts the clock cycles associated with state bundles from the calculation of actual number of clock cycles.

It should be noted that the estimated clock cycle count for each unit can be generated from sources other than the performance measuring tool discussed above. Alternatively, the estimated clock cycle count can be generated by a designer of the unit. In addition, in one implementation, each unit in the chip 200 is associated with its own unit test-bench, and each unit test-bench can operate independently from the others. In other words, unit-level testing can occur in parallel, and different traffic patterns can be applied to the unit test-benches.

Furthermore, the unit test-bench 400 can be reconfigured to verify the performance of a group of units (also referred to as a super-unit). The theory cycle count is computed as a user specified Boolean equation of the various units that make up the super-unit. The flexibility of this alternative setup also allows certain latency to be subtracted out through this super-unit test-bench. In particular, the theory cycle count typically specifies the number of cycles required to process a given work load but fails to consider the latency to go through a single unit. For a super-unit, this latency may be significant and needs to be considered.

Figure 5:
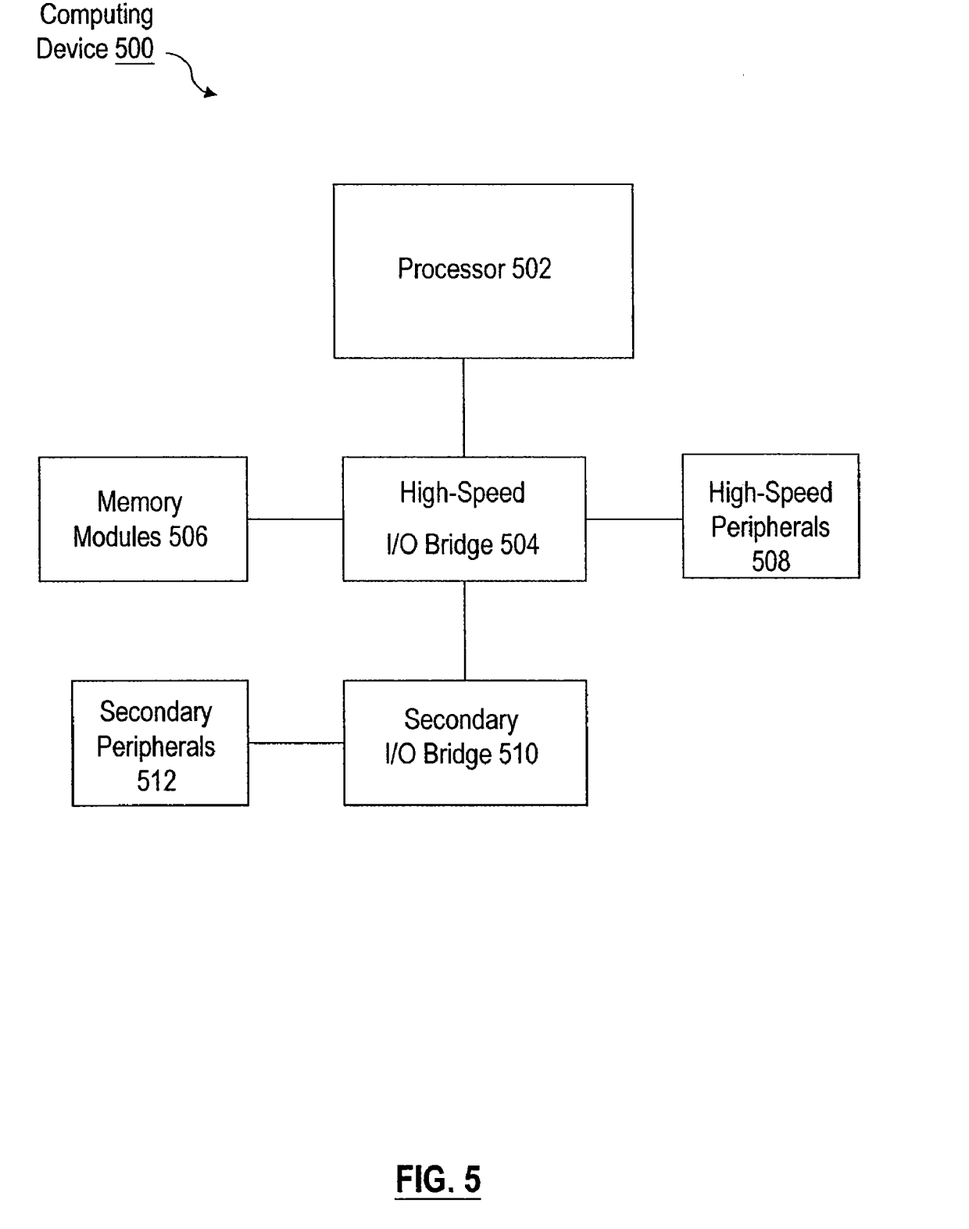
FIG. 5 is a simplified block diagram of a computing device configured to implement one or more aspects of the present invention.

FIG. 5 is a simplified block diagram of a computing device 500 configured to implement one or more aspects of the present invention. The computing device 500 includes a processor 502, which accesses a memory module 506 via a high speed I/O bridge 504. The high speed I/O bridge 504 also manages the connections from the processor 502 to on-chip memory modules, such as caches, and a dedicated graphics processing channel, such as the Accelerated Graphics Port.

The memory module 506 stores information and instructions to be executed by the processor 502 and may store temporary variables or other intermediate information during the execution of the instructions.

The high speed I/O bridge 504 manages the data-intensive pathways and supports high speed peripherals, such as, without limitation, display, gigabit Ethernet, fiber channel, and Redundant Array of Independent Disks ("RAID"). The high speed I/O bridge 504 is also coupled with secondary a I/O bridge 510, which supports secondary peripherals 512, such as, without limitation, disk controllers, Universal Serial Bus ("USB"), audio, serial, system Basic Input/Output System ("BIOS"), the Industry Standard Architecture ("ISA") bus, the interrupt controller, and the Intelligent Driver Electronics ("IDE") channels.

In one implementation, various programs containing sequences of instructions are developed. Specifically, a performance test program is designed to generate the system level stimuli as discussed above. A performance simulator program or a performance modeling program is developed to generate the estimated clock cycle count. An FModel program is developed to generate interface transactions and state bundles. A unit test-bench program is developed to measure unit-level performance data and determine whether performance correctness is achieved. The instructions of these various programs generally are read into the main memory module 506 before they are executed by the processor 502. Execution of these instructions causes the processor 502 to perform the process steps described herein. In alternative embodiments, hard-wired circuitry may be used in place of or in combination with software instructions to implement one or more aspects of the present invention.

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention. Therefore, the above examples, embodiments, and drawings should not be deemed to be the only embodiments, and are presented to illustrate the flexibility and advantages of the present invention as defined by the following claims.

We claim:

1. A computer-implemented method for verifying the performance of a unit in an integrated circuit, the method comprises:

generating, by a processor during processing of a performance measuring tool, expected performance data, expected functional outputs, and interface transactions for the unit based on system level stimulus for the entire integrated circuit;

embedding the expected performance data in the interface transactions, wherein the expected performance data resides in a data structure with identification information of the unit and a start trigger indicative of a beginning of a test or a end trigger indicative of an end to the test;

applying, by the processor during processing of a register transfer level (RTL) implementation of the unit, the interface transactions to generate actual functional outputs and actual performance data for the unit;

verifying whether the actual functional outputs are correct based on the expected functional outputs; and determining whether the expected performance of the unit is achieved based on the comparison between the expected performance data and the actual performance data.

2. The method of claim 1, wherein the determining step further comprises:

initiating a computation of clock cycles after the RTL implementation of the unit receives the start trigger to operate on the interface transactions;

stopping the computation of clock cycles to establish an actual cycle count after the RTL implementation of the unit receives the end trigger, wherein the actual cycle count is the actual performance data for the unit; and comparing the actual cycle count with the expected performance data retrieved from the data structure.

3. The method of claim 2, further comprising excluding a clock cycle from the actual cycle count each time the RTL implementation of the unit receives the data structure.

4. The method of claim 1, wherein the expected performance data is an estimated clock cycles count for the unit to respond to the interface transactions.

5. A computer-readable medium containing a sequence of instructions, which when executed by a processor in a computing device, causes the computing device to verify the performance of a unit in an integrated circuit by performing the steps of:

generating, during processing of a performance measuring tool, expected performance data, expected functional outputs, and interface transactions for a unit based on system level stimulus for the entire integrated circuit;

embedding the expected performance data in the interface transactions, wherein the expected performance data resides in a data structure with identification information of the unit and a start trigger indicative of a beginning of a test or a end trigger indicative of an end to the test;

applying, during processing of a register transfer level (RTL) implementation of the unit, the interface transactions to generate actual functional outputs and actual performance data for the unit;

verifying whether the actual functional outputs are correct based on the expected functional outputs; and determining whether the expected performance of the unit is achieved based on the comparison between the expected performance data and the actual performance data.

6. The computer-readable medium of claim 5, further containing a sequence of instructions, which when executed by the processor, causes the computing device to:

initiate the computation of clock cycles after the RTL implementation of the unit receives the start trigger to operate on the workload;

stop the computation of clock cycles to establish an actual cycle count after the RTL implementation of the unit receives the end trigger, wherein the actual cycle count is the actual performance data of the unit; and compare the actual cycle count with the expected performance data retrieved from the data structure.

7. The computer-readable medium of claim 6, further containing a sequence of instructions, which when executed by the processor, causes the computing device to exclude a clock cycle from the actual cycle count each time the RTL implementation of the unit receives the data structure.

8. The computer-readable medium of claim 5, wherein the expected performance data is an estimated clock cycles count for the unit to respond to the interface transactions.

9. A computing device configured to verify the performance of a unit in an integrated circuit, the computing device comprises:
   a memory module; and
   a processor configured to:
      generate, during processing of a performance measuring tool, expected performance data, expected functional outputs, and interface transactions for a unit based on system level stimulus for the entire integrated circuit;
      embed the expected performance data in the interface transactions, wherein the expected performance data resides in a data structure with identification information of the unit and the data structure includes a start trigger indicative of a beginning of a test or an end trigger indicative of an end to the test;
      apply, during processing of a register transfer level (RTL) implementation of the unit, the interface transactions to generate actual functional outputs and actual performance data for the unit to;
      verify whether the actual functional outputs are correct based on the expected functional outputs; and
      determine whether the expected performance of the unit is achieved based on the comparison between the expected performance data and the actual performance data.

10. The computing device of claim 9, wherein the processor is further configured to:
   initiate the computation of clock cycles after the RTL implementation of the unit receives the start trigger to operate on the interface transactions;
   stop the computation of clock cycles to establish an actual cycle count after the RTL implementation of the unit receives the end trigger, wherein the actual cycle count is the actual performance data for the unit; and
   compare the actual cycle count with the expected performance data.

11. The computing device of claim 9, wherein the processor is further configured to exclude a clock cycle from the actual cycle count each time the RTL implementation of the unit receives the data structure.

12. The computing device of claim 9, wherein the expected performance data is an estimated clock cycles count for the unit to respond to the interface transactions.

13. A computer-implemented method for verifying the performance of a unit in an integrated circuit, the method comprises:
   generating, by a processor during processing of a performance measuring tool, expected performance data, expected functional outputs, and interface transactions for the unit based on system level stimulus for the entire integrated circuit;
   computing a theory cycle count for a group of units that includes the unit, wherein the theory cycle count is computed as a user specified Boolean equation of the unit and other units that are included in the group of units;
   embedding the expected performance data in the interface transactions;
   applying, by the processor during processing of a register transfer level (RTL) implementation of the unit, the interface transactions to generate actual functional outputs and actual performance data for the unit;
   verifying whether the actual functional outputs are correct based on the expected functional outputs; and
   determining whether the expected performance of the unit is achieved based on the comparison between the expected performance data and the actual performance data.

14. A computer-readable medium containing a sequence of instructions, which when executed by a processor in a computing device, causes the computing device to verify the performance of a unit in an integrated circuit by performing the steps of:
   generating, during processing of a performance measuring tool, expected performance data, expected functional outputs, and interface transactions for a unit based on system level stimulus for the entire integrated circuit;
   computing a theory cycle count for a group of units that includes the unit, wherein the theory cycle count is computed as a user specified Boolean equation of the unit and other units that are included in the group of units;
   embedding the expected performance data in the interface transactions;
   applying, during processing of a register transfer level (RTL) implementation of the unit, the interface transactions to generate actual functional outputs and actual performance data for the unit;
   verifying whether the actual functional outputs are correct based on the expected functional outputs; and
   determining whether the expected performance of the unit is achieved based on the comparison between the expected performance data and the actual performance data.

15. A computing device configured to verify the performance of a unit in an integrated circuit, the computing device comprises:
   a memory module; and
   a processor configured to:
      generate, during processing of a performance measuring tool, expected performance data, expected functional outputs, and interface transactions for a unit based on system level stimulus for the entire integrated circuit;
      compute a theory cycle count for a group of units that includes the unit, wherein the theory cycle count is computed as a user specified Boolean equation of the unit and other units that are included in the group of units;
      embed the expected performance data in the interface transactions;
      apply, during processing of a register transfer level (RTL) implementation of the unit, the interface transactions to generate actual functional outputs and actual performance data for the unit to;
      verify whether the actual functional outputs are correct based on the expected functional outputs; and
      determine whether the expected performance of the unit is achieved based on the comparison between the expected performance data and the actual performance data.

* * * * *